(12) United States Patent
Chen et al.

(10) Patent No.: US 9,196,595 B2
(45) Date of Patent: Nov. 24, 2015

(54) SEMICONDUCTOR BONDING STRUCTURE

(71) Applicant: Advanced Semiconductor Engineering, Inc., Kaohsiung (TW)

(72) Inventors: Kuo-Hua Chen, Kaohsiung (TW); Tzu-Hua Lin, Kaohsiung (TW); Kuan-Neng Chen, Kaohsiung (TW); Yan-Pin Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 14/192,029

(22) Filed: Feb. 27, 2014

(65) Prior Publication Data

US 2014/0239494 A1    Aug. 28, 2014

(30) Foreign Application Priority Data

Feb. 28, 2013   (CN) .......................... 2013 1 0064575

(51) Int. Cl.
*H01L 23/00*   (2006.01)
*H01L 21/56*   (2006.01)
(Continued)

(52) U.S. Cl.
CPC .............. *H01L 24/11* (2013.01); *H01L 21/563* (2013.01); *H01L 23/3128* (2013.01); *H01L 23/49816* (2013.01); *H01L 23/49827* (2013.01); *H01L 24/13* (2013.01); *H01L 24/16* (2013.01); *H01L 24/81* (2013.01); *H01L 25/0657* (2013.01); *H01L 25/50* (2013.01); *H01L 2224/0401* (2013.01); *H01L 2224/05022* (2013.01); *H01L 2224/05124* (2013.01); *H01L 2224/05147* (2013.01); *H01L 2224/05572* (2013.01); *H01L 2224/13082* (2013.01); *H01L 2224/13111* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01); *H01L 2224/13157* (2013.01); *H01L 2224/13164* (2013.01); *H01L 2224/13166* (2013.01); *H01L 2224/13169* (2013.01); *H01L 2224/13176* (2013.01); *H01L 2224/13178* (2013.01); *H01L 2224/16146* (2013.01); *H01L 2224/16227* (2013.01); *H01L 2224/16235* (2013.01); *H01L 2224/16501* (2013.01); *H01L 2224/73204* (2013.01); *H01L 2224/75251* (2013.01);
(Continued)

(58) Field of Classification Search
CPC ......... H01L 24/11; H01L 24/16; H01L 24/13; H01L 24/81; H01L 23/3218; H01L 25/065; H01L 23/49816; H01L 23/49827; H01L 25/0657; H01L 25/50; H01L 21/563
See application file for complete search history.

(56) References Cited

U.S. PATENT DOCUMENTS 7,183,648 B2   2/2007   Ramanathan et al.
7,781,325 B2   8/2010   Lee et al.
(Continued)

*Primary Examiner* — William Coleman
(74) *Attorney, Agent, or Firm* — Foley & Lardner LLP; Cliff Z. Liu; Angela D. Murch

(57) ABSTRACT

The disclosure relates to a semiconductor bonding structure and process and a semiconductor chip. The semiconductor bonding structure includes a first pillar, a first interface, an intermediate area, a second interface and a second pillar in sequence. The first pillar, the second pillar and the intermediate area include a first metal. The first interface and the second interface include the first metal and an oxide of a second metal. The content percentage of the first metal in the first interface and the second interface is less than that of the first metal in the intermediate area.

17 Claims, 5 Drawing Sheets

(51) Int. Cl.
*H01L 25/065* (2006.01)
*H01L 25/00* (2006.01)
*H01L 23/498* (2006.01)
*H01L 23/31* (2006.01)

(52) U.S. Cl.
CPC ............... *H01L2224/75252* (2013.01); *H01L 2224/8183* (2013.01); *H01L 2224/81193* (2013.01); *H01L 2224/81203* (2013.01); *H01L 2225/06513* (2013.01); *H01L 2225/06517* (2013.01); *H01L 2225/06541* (2013.01); *H01L 2225/06568* (2013.01); *H01L 2924/15788* (2013.01)

(56) References Cited

U.S. PATENT DOCUMENTS

| | | | |
|---|---|---|---|
| 7,952,171 B2 | 5/2011 | Pratt | |
| 7,960,834 B2 * | 6/2011 | Funaki | 257/762 |
| 8,093,718 B2 | 1/2012 | Chang | |
| 8,203,208 B2 | 6/2012 | Ramanathan et al. | |
| 8,823,167 B2 * | 9/2014 | Wu et al. | 257/737 |
| 2010/0301485 A1 * | 12/2010 | Sekine et al. | 257/769 |
| 2011/0215467 A1 | 9/2011 | Hsu et al. | |
| 2013/0037946 A1 * | 2/2013 | Kim et al. | 257/737 |
| 2013/0193593 A1 * | 8/2013 | Lin et al. | 257/E23.068 |
| 2014/0153210 A1 * | 6/2014 | Uzoh | 361/803 |
| 2015/0061120 A1 * | 3/2015 | Yang et al. | 257/737 |

* cited by examiner

SEMICONDUCTOR BONDING STRUCTURE

CROSS-REFERENCE TO RELATED APPLICATION

This application claims the benefit of Chinese Patent Application No. 201310064575.5, filed on Feb. 28, 2013, the content of which is incorporated herein by reference in its entirety.

BACKGROUND OF THE INVENTION

1. Field of the Invention

The present invention relates to a semiconductor bonding structure and process and a semiconductor chip, and more particularly to a semiconductor bonding structure and process that can be completed in a low-temperature environment without use of solder.

2. Description of the Related Art

In a semiconductor flip-chip bonding process, a nickel layer is plated on a metal pillar of an upper chip to serve as a barrier layer, and then a solder is formed on the nickel layer. Next, the upper chip is placed on a lower chip or a substrate, so that the solder on the metal pillar contacts a surface finish layer on a bonding pad of the lower chip or the substrate. Then, a reflow process is performed, so that the solder is molten and bonded to the bonding pad, to form a flip-chip bonding structure.

In this process, a solder is used to attain bonding. Since the outer diameter of the solder cannot be effectively decreased, a pitch between metal pillars cannot be effectively reduced. In addition, in order to make the solder reach a molten state, the solder is heated to above 300° C., and in such a high-temperature environment, the upper chip and the lower chip or the substrate are prone to warping, and the metal pillar is easily oxidized. To avoid oxidation of the metal pillar, another known technique is to perform the high-temperature bonding step in a vacuum environment, which will increase the manufacturing cost, and still cannot solve the problem of warpage.

Therefore, it is desirable to provide a semiconductor bonding structure and process and a semiconductor chip, to solve the above problems.

SUMMARY OF THE INVENTION

One aspect of the disclosure relates to a semiconductor bonding structure. In an embodiment, the semiconductor bonding structure includes a first pillar, a second pillar, an intermediate area, a first interface, and a second interface. The first pillar includes a first metal. The second pillar includes the first metal. The intermediate area is located between the first pillar and the second pillar, and includes the first metal. The first interface is located between the first pillar and the intermediate area, and includes the first metal and an oxide of a second metal, wherein the content percentage of the first metal in the first interface is less than that of the first metal in the intermediate area. The second interface is located between the second pillar and the intermediate area, and includes the first metal and the oxide of the second metal, wherein the content percentage of the first metal in the second interface is less than that of the first metal in the intermediate area.

Another aspect of the disclosure relates to a semiconductor chip. In an embodiment, the semiconductor chip includes a chip body, a wiring layer, a protection layer, an under bump metallurgy (UBM) layer, a pillar and a diffusion layer. The chip body has a first surface. The wiring layer is located on the first surface of the chip body. The protection layer is located on the first surface of the chip body, and has an opening, to expose part of the wiring layer. The UBM layer is located at the opening of the protection layer, and contacts the wiring layer. The pillar is located on the UBM layer, the pillar includes a first metal, and the first metal is selected from the group consisting of silver, gold, aluminum and copper. The diffusion layer is located at an end of the pillar, the diffusion layer includes a second metal, the second metal is different from the first metal, and the second metal is selected from the group consisting of silver, gold, platinum, palladium, osmium, iridium, ruthenium, titanium, magnesium, aluminum, copper, cobalt, nickel and zinc. The thickness of the diffusion layer is 1 nm to 30 nm.

A further aspect of the disclosure relates to a semiconductor bonding process. In an embodiment, the semiconductor bonding process includes: (a) providing a first semiconductor element and a second semiconductor element, the first semiconductor element including at least one first pillar and at least one first diffusion layer, the first pillar including a first metal, the first diffusion layer being located at an end of the first pillar and including a second metal, the second semiconductor element including at least one second pillar and at least one second diffusion layer, the second pillar including the first metal, the second diffusion layer being located at an end of the second pillar and including the second metal, and the thickness of either, or both, the first and second diffusion layer being 1 nm to 30 nm; (b) bonding the first semiconductor element to the second semiconductor element, so that the first diffusion layer contacts the second diffusion layer; and (c) applying a bonding force to the first semiconductor element and the second semiconductor element for a period of time, so that the first metal of the first pillar is diffused towards the second pillar, the first metal of the second pillar is diffused towards the first pillar, and they contact to form an intermediate area; an oxide of the second metal of the first diffusion layer is diffused towards the first pillar and is mixed with the first metal to form a first interface; and the oxide of the second metal of the second diffusion layer is diffused towards the second pillar and is mixed with the first metal to form a second interface.

BRIEF DESCRIPTION OF THE DRAWINGS

Common reference numerals are used throughout the drawings and the detailed description to indicate the same or similar elements. Embodiments of the present invention will be more apparent from the following detailed description taken in conjunction with the accompanying drawings.

DETAILED DESCRIPTION OF THE INVENTION

Figure 1:
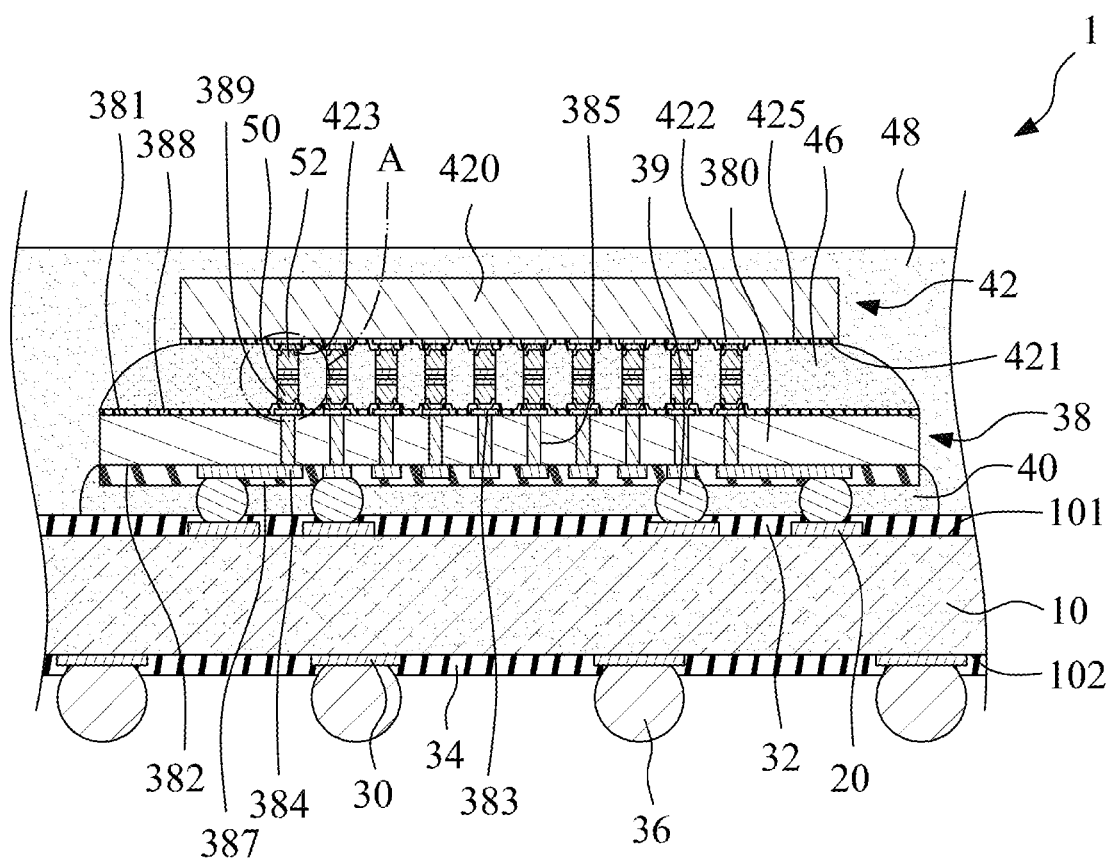
FIG. 1 is a schematic cross-sectional view of an embodiment of a semiconductor package structure according to the present invention.

FIG. 1 is a schematic cross-sectional view of an embodiment of a semiconductor package structure according to the present invention. The semiconductor package structure 1 includes a substrate 10, a plurality of external solder balls 36, a first semiconductor element 38, a first underfill 40, a second semiconductor element 42, a second underfill 46 and a molding material 48.

The substrate 10 is a silicon substrate, a wafer or a glass substrate, which has an upper surface 101, a lower surface 102, an upper circuit layer 20, a lower circuit layer 30, an upper protection layer 32 and a lower protection layer 34. The upper circuit layer 20 is located on the upper surface 101 of the substrate 10, and the lower circuit layer 30 is located on the lower surface 102 of the substrate 10. The upper protection layer 32 covers the upper circuit layer 20 and the upper surface 101 of the substrate 10, and has a plurality of openings to expose part of the upper circuit layer 20. The lower protection layer 34 covers the lower circuit layer 30 and the lower surface 102 of the substrate 10, and has a plurality of openings to expose part of the lower circuit layer 30. In this embodiment, the material of the upper circuit layer 20 and the lower circuit layer 30 is copper, and the upper protection layer 32 and the lower protection layer 34 are solder masks, the material of which is, for example, polyimide (PI). The external solder balls 36 are located on the exposed lower circuit layer 30, for connection to the outside.

The first semiconductor element 38 is a chip or an interposer, and includes a first semiconductor element body 380 (for example, a chip body or an interposer body), an upper wiring layer 383, a lower wiring layer 384, a plurality of conductive vias 385, a lower protection layer 387, an upper protection layer 388, a plurality of first UBM layers 389, a plurality of first pillars 50 and a plurality of solder balls 39. The first semiconductor element body 380 has an upper surface 381 and a lower surface 382. The upper wiring layer 383 and the lower wiring layer 384 are respectively located on the upper surface 381 and the lower surface 382 of the first semiconductor element body 380. In this embodiment, the upper wiring layer 383 and the lower wiring layer 384 include a plurality of electrically insulated segments, the material of which is aluminum, copper or an alloy or a mixture of aluminum-copper.

The conductive vias 385 penetrate through the first semiconductor element body 380, and contact and are electrically connected to the upper wiring layer 383 and the lower wiring layer 384. The lower protection layer 387 covers the lower wiring layer 384 and the lower surface 382 of the first semiconductor element body 380, and has a plurality of openings to expose part of the lower wiring layer 384. The upper protection layer 388 covers the upper wiring layer 383 and the upper surface 381 of the first semiconductor element body 380, and has a plurality of openings to expose part of the upper wiring layer 383.

The first UBM layers 389 are located at the openings of the upper protection layer 388, and contact the upper wiring layer 383. The first pillars 50 are located on the first UBM layers 389. The solder balls 39 contact and are electrically connected to the exposed lower wiring layer 384 and the exposed upper circuit layer 20. The first underfill 40 is located between the first semiconductor element body 380 and the substrate 10 to protect the solder balls 39. In this embodiment, the upper protection layer 388 and the lower protection layer 387 are solder masks, the material of which is, for example, PI.

The second semiconductor element 42 is a chip, and includes a second semiconductor element body 420 (for example, a chip body), a wiring layer 422, a protection layer 425, a plurality of second UBM layers 423 and a plurality of second pillars 52. The second semiconductor element body 420 has a first surface 421. The wiring layer 422 is located on the first surface 421 of the second semiconductor element body 420. In this embodiment, the wiring layer 422 includes a plurality of electrically insulated segments, the material of which is aluminum, copper or an alloy or a mixture of aluminum-copper.

The protection layer 425 covers the wiring layer 422 and the first surface 421 of the second semiconductor element body 420, and has a plurality of openings to expose part of the wiring layer 422. The second UBM layers 423 are located at the openings of the protection layer 425, and contact the wiring layer 422. The second pillars 52 are located on the second UBM layers 423, and are physically bonded to and are electrically connected to the first pillars 50. The protection layer 425 may be a solder mask (the material of which is, for example, PI) or a passivation layer (the material of which is, for example, a metal oxide).

The second underfill 46 is located between the first semiconductor element 38 and the second semiconductor element 42 to protect the first pillars 50 and the second pillars 52. The molding material 48 is located on the upper surface 101 of the substrate 10, to cover the first semiconductor element 38, the second semiconductor element 42, the first underfill 40 and the second underfill 46. It should be understood that the first underfill 40 and the second underfill 46 may be omitted.

Figure 2:
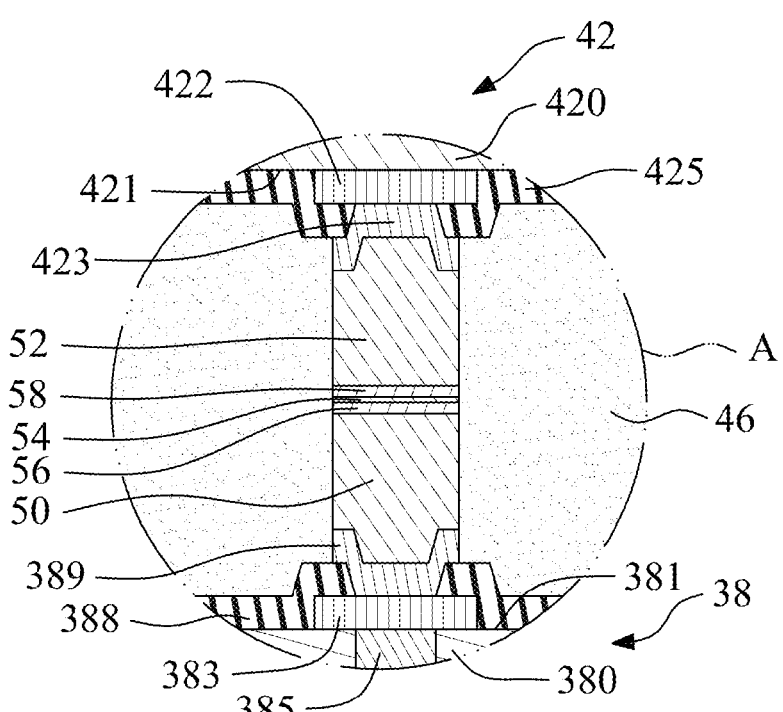
FIG. 2 is a schematic enlarged view of an area A of an embodiment of a bonding structure between the first semiconductor element and the second semiconductor element in the semiconductor package structure of FIG. 1.

FIG. 2 is a schematic enlarged view of an area A of an embodiment of a bonding structure between the first semiconductor element 38 and the second semiconductor element 42 in the semiconductor package structure 1 of FIG. 1. In this embodiment, the semiconductor bonding structure includes a first pillar 50, a second pillar 52, an intermediate area 54, a first interface 56 and a second interface 58. The first pillar 50 is located on the first UBM layer 389 of the first semiconductor element 38, and includes a first metal. The second pillar 52 is located on the second UBM layer 423 of the second semiconductor element 42, and includes the first metal. The first metal is selected from the group consisting of silver, gold, aluminum and copper. In this embodiment, the first metal is copper, that is, the first pillar 50 and the second pillar 52 are copper metal pillars. The intermediate area 54 is located between the first pillar 50 and the second pillar 52, and includes the first metal. It is also contemplated that the first pillar 50, the second pillar 52, and the intermediate area 54 may include respective metals that are the same or different.

The first interface 56 is located between the first pillar 50 and the intermediate area 54, and includes the first metal and an oxide of a second metal, wherein the content percentage of the first metal in the first interface 56 is less than that of the first metal in the intermediate area 54. Similarly, the second interface 58 is located between the second pillar 52 and the intermediate area 54, and includes the first metal and the oxide of the second metal, wherein the content percentage of the first metal in the second interface 58 is less than that of the first metal in the intermediate area 54. It is also contemplated that the first interface 56 and the second interface 58 may include respective metal oxides that are the same or different.

The first metal is different from the second metal, and the second metal is selected from the group consisting of silver, gold, platinum, palladium, osmium, iridium, ruthenium, titanium, magnesium, aluminum, copper, cobalt, nickel and zinc. In this embodiment, the second metal is titanium, and the oxide of the second metal is titanium dioxide. It should be noted that, in this embodiment, the intermediate area 54, the first pillar 50 and the second pillar 52 do not include the oxide of the second metal (that is, titanium dioxide).

In this embodiment, the first interface 56 contacts the first pillar 50 and the intermediate area 54, and the second interface 58 contacts the second pillar 52 and the intermediate area 54. However, in other embodiments, the first interface 56 is a discontinuous interface (that is, it is not a complete plane) so that the first pillar 50 contacts the intermediate area 54, and the second interface 58 is a discontinuous interface (that is, it is not a complete plane) so that the second pillar 52 contacts the intermediate area 54. The first pillar 50, the second pillar 52 and the intermediate area 54 are mainly made of a metal material, especially a highly conductive metal material, and therefore can improve the electrical connection effect through contact with each other.

Figure 3:
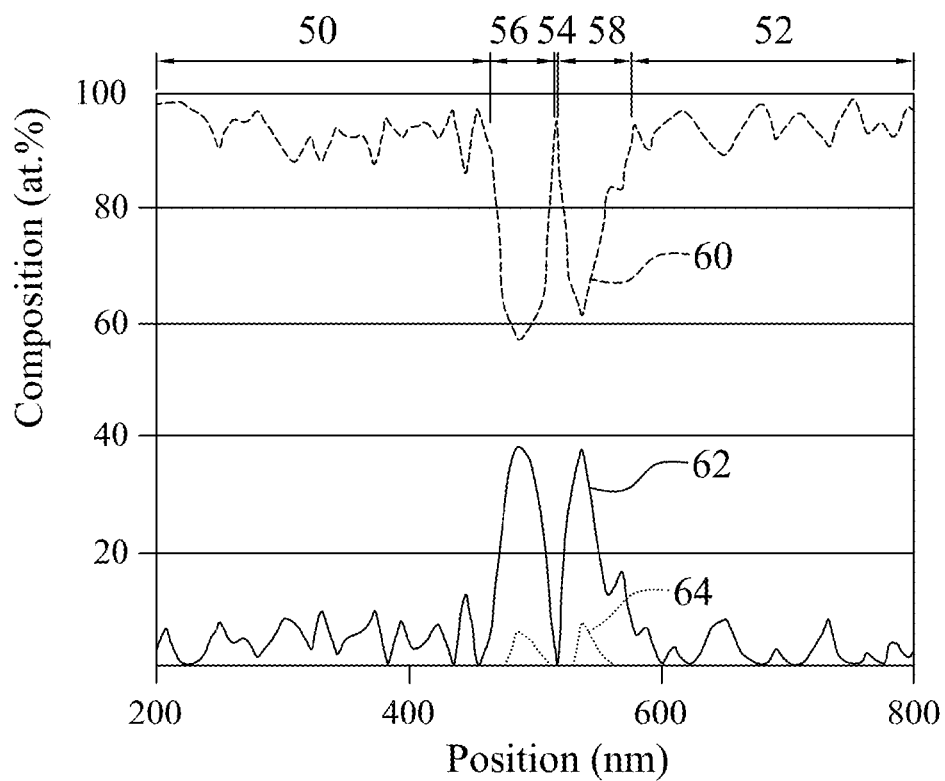
FIG. 3 is a graph of a transmission electron microscopy (TEM) analysis of the bonding structure of FIG. 2.

FIG. 3 is a graph of a transmission electron microscopy (TEM) analysis of the bonding structure of FIG. 2, wherein a curve 60 denotes the percentage (that is, the atomic percentage or at. %) of copper, a curve 62 denotes the percentage of oxygen (that is, the atomic percentage or at. %), and a curve 64 denotes the percentage of titanium (that is, the atomic percentage or at. %). In the first pillar 50, the intermediate area 54 and the second pillar 52, the percentage of copper is more than 90%, and the rest is oxygen. In other words, elements contained in the first pillar 50, the intermediate area 54 and the second pillar 52 and the percentages thereof are substantially the same. In the first interface 56 and the second interface 58, the percentage of copper is decreased to below 90%, the percentage of oxygen is significantly increased (more than 10%), and titanium is added, and therefore it can be known that an oxide of titanium (titanium dioxide) is contained. As can be seen from FIG. 3, the content percentage of copper in the first interface 56 and the second interface 58 is less than that of copper in the intermediate area 54, and is also less than that of copper in the first pillar 50 and the second pillar 52. The content percentage of oxygen in the first interface 56 and the second interface 58 is greater than that of oxygen in the intermediate area 54. The intermediate area 54, the first pillar 50 and the second pillar 52 do not contain titanium dioxide (for example, the percentage of titanium is less than 1% or less than a detectable threshold).

In the bonding structure of this embodiment, copper-to-copper bonding can be achieved without use of solder; therefore, a pitch between the first pillars 50 or between the second pillars 52 can be effectively reduced, thereby achieving a fine pitch. In addition, the bonding structure can be completed at a low temperature (for example, lower than about 180° C.), and warpage does not easily occur. Besides, the thrust test of the bonding structure can reach 37 kg/cm$^2$ or more, which shows that the bonding effect is quite good.

Figure 4:
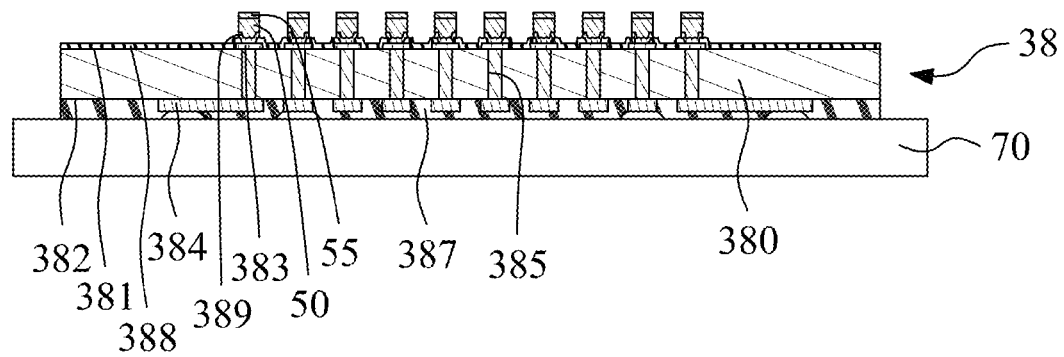
FIG. 4, FIG. 4a, FIG. 5, FIG. 5a, FIG. 6, FIG. 6a and FIG. 7 are schematic views of an embodiment of a semiconductor bonding process according to the present invention.
Figure 4A:
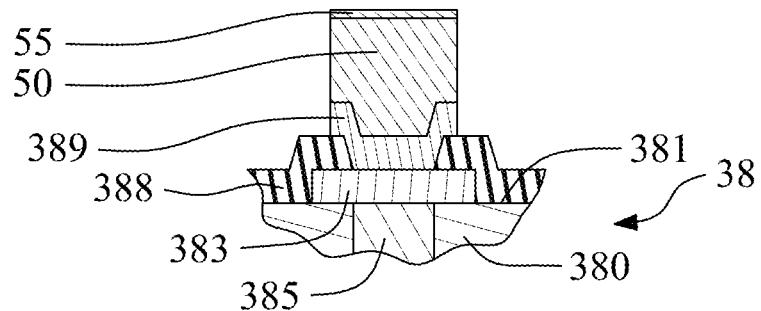

FIG. 4 to FIG. 7 are schematic views of an embodiment of a semiconductor bonding process according to the present invention. Referring to FIG. 4 and FIG. 4a, wherein FIG. 4a is a schematic partially enlarged view of FIG. 4, the first semiconductor element 38 is provided to a stage 70. The first semiconductor element 38 includes the first semiconductor element body 380, the upper wiring layer 383, the lower wiring layer 384, the conductive vias 385, the lower protection layer 387, the upper protection layer 388, the first UBM layers 389, the first pillars 50 and a plurality of first diffusion layers 55. The upper wiring layer 383 and the lower wiring layer 384 are respectively located on the upper surface 381 and the lower surface 382 of the first semiconductor element body 380. The conductive vias 385 penetrate through the first semiconductor element body 380, and contact and are electrically connected to the upper wiring layer 383 and the lower wiring layer 384. The lower protection layer 387 covers the lower wiring layer 384 and the lower surface 382 of the first semiconductor element body 380, and has a plurality of openings to expose part of the lower wiring layer 384. The upper protection layer 388 covers the upper wiring layer 383 and the upper surface 381 of the first semiconductor element body 380, and has a plurality of openings to expose part of the upper wiring layer 383. The first UBM layers 389 are located at the openings of the upper protection layer 388, and contact the upper wiring layer 383. The first pillars 50 are located on the first UBM layers 389. The first diffusion layers 55 are located at ends of the first pillars 50, and have a thickness of about 1 nm to about 30 nm, preferably about 5 nm to about 30 nm. The first pillar 50 includes the first metal, and the first diffusion layer 55 includes the second metal.

Figure 5:
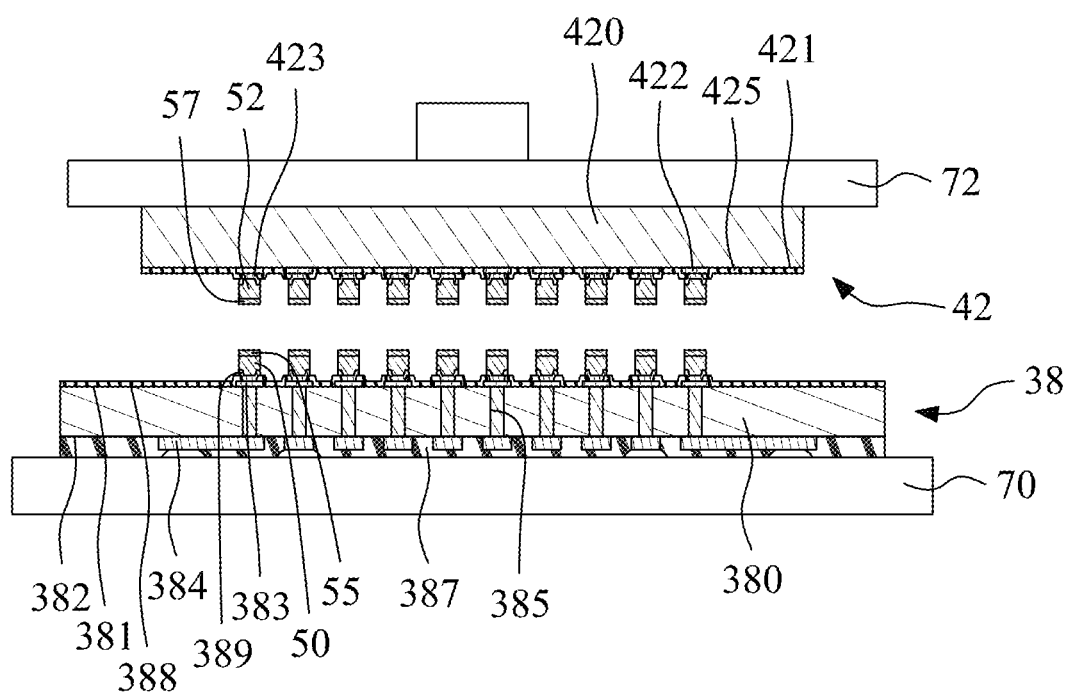
Figure 5A:
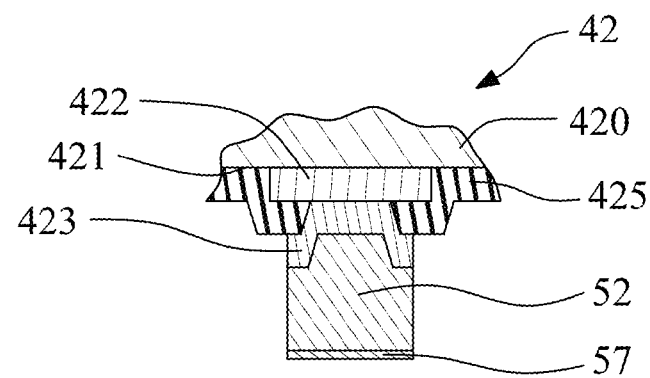
Figure 5A:
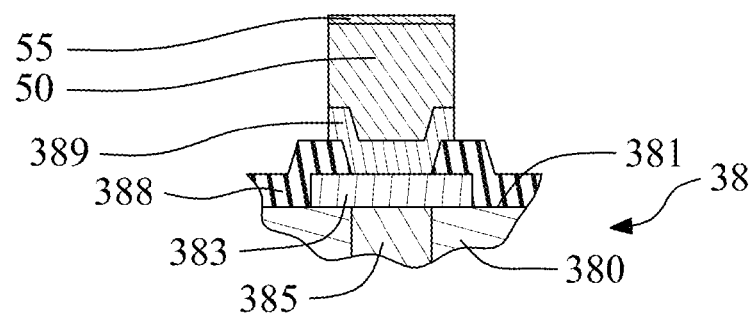

Referring to FIG. 5 and FIG. 5a, wherein FIG. 5a is a schematic partially enlarged view of FIG. 5, the second semiconductor element 42 is provided to a thermal pressing head 72. The second semiconductor element 42 is a chip, and includes the second semiconductor element body 420, the wiring layer 422, the protection layer 425, the second UBM layers 423, the second pillars 52 and a plurality of second diffusion layers 57. The wiring layer 422 is located on the first surface 421 of the second semiconductor element body 420. The protection layer 425 covers the wiring layer 422 and the first surface 421 of the second semiconductor element body 420, and has a plurality of openings to expose part of the wiring layer 422. The second UBM layers 423 are located at the openings of the protection layer 425, and contact the wiring layer 422. The second pillars 52 are located on the second UBM layers 423. The second diffusion layers 57 are located at ends of the second pillars 52, and have a thickness of about 1 nm to about 30 nm, preferably about 5 nm to about 30 nm. The second pillar 52 includes the first metal, and the second diffusion layer 57 includes the second metal.

Figure 6:
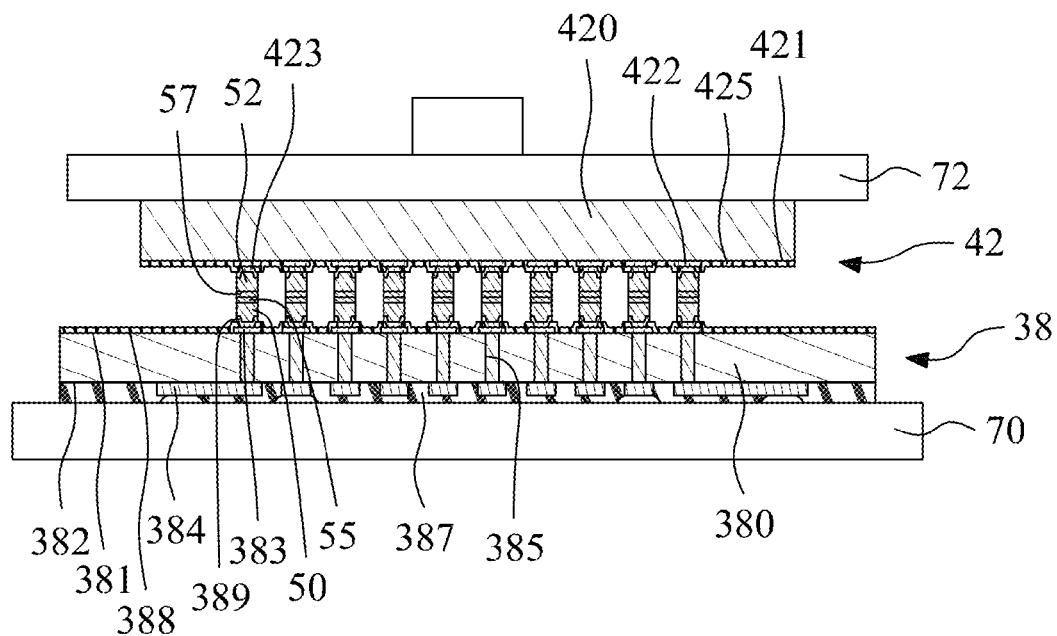
Figure 6A:
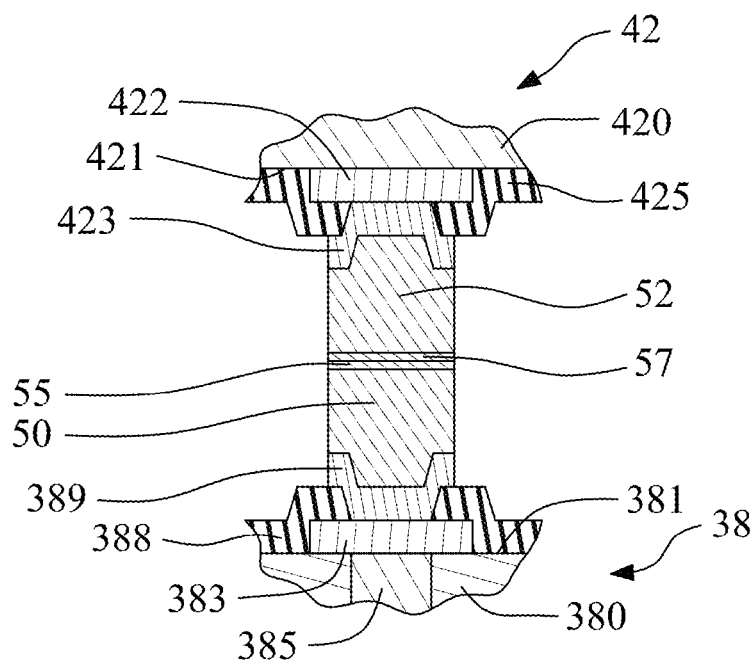

Referring to FIG. 6 and FIG. 6a, wherein FIG. 6a is a schematic partially enlarged view of FIG. 6, the thermal pressing head 72 is moved downward, to bond the first semiconductor element 38 to the second semiconductor element 42, so that the first diffusion layer 55 contacts the second diffusion layer 57.

Figure 7:
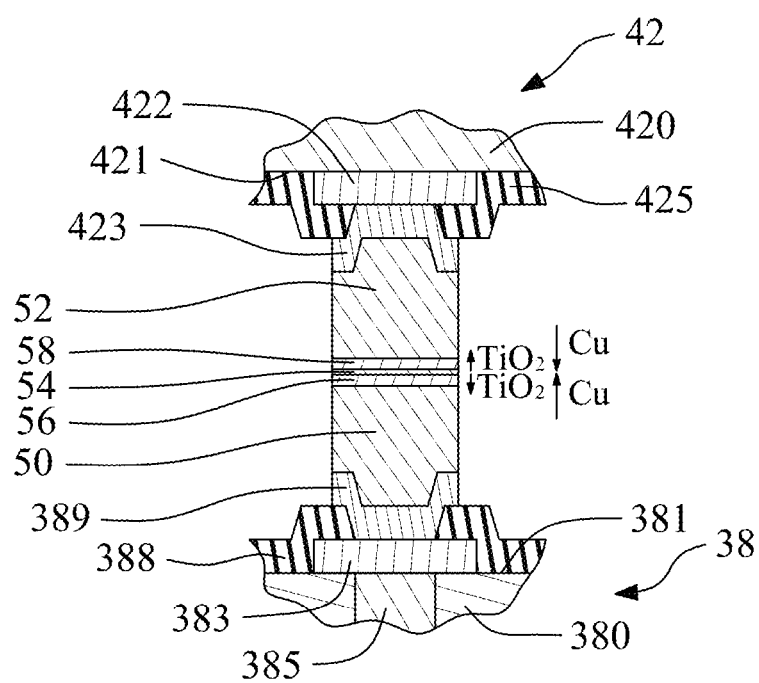

Referring to FIG. 7, a bonding force is applied to the first semiconductor element 38 and the second semiconductor element 42 for a period of time. In this embodiment, the bonding force is about 100 N, and is applied for about 50 minutes. Meanwhile, the stage 70 and the thermal pressing head 72 are used at atmospheric pressure (about 1 atm) separately to heat the first pillar 50, the first diffusion layer 55, the second pillar 52 and the second diffusion layer 57, to provide a bonding temperature, wherein the bonding temperature is lower than about 180° C., preferably higher than about 150° C. and lower than about 180° C., so that the first diffusion layer 55 and the second diffusion layer 57 form the oxide of the second metal (that is, titanium dioxide). It should be noted that this embodiment does not need to be performed in a vacuum environment, and therefore a vacuum pumping step is not necessary, thereby achieving advantages of easy manufacturing and low cost.

At this time, the first metal (copper) of the first pillar 50 is diffused (upward) towards the second pillar 52, the first metal (copper) of the second pillar 52 is diffused (downward) towards the first pillar 50, and they contact each other in the middle of the bonding structure and are fused to form the intermediate area 54. Meanwhile, the oxide of the second metal (titanium dioxide) of the first diffusion layer 55 is diffused (downward) towards the first pillar 50 and is mixed with the first metal to form the first interface 56; and the oxide of the second metal (titanium dioxide) of the second diffusion layer 57 is diffused (upward) towards the second pillar 52 and is mixed with the first metal to form the second interface 58. In this way, the bonding structure as shown in FIG. 2 is formed.

The interdiffusion mechanism is described as follows. Copper (or Cu) has lower activation energy at the surface between the first pillar 50 and the first diffusion layer 55 and a smaller atomic volume (about 72 bohr$^3$) than titanium (or Ti) vacancy volume (about 75.48 bohr$^3$). Hence, Cu has a tendency to diffuse upwardly towards the surface between the first pillar 50 and the first diffusion layer 55 through Ti vacancies, whereas Ti/TiOx tends to diffuse toward the opposite direction. It is noted the interdiffusion mechanism between the second pillar 52 and the second diffusion layer 57 is the same as described above.

In the bonding structure, the intermediate area 54 is located between the first pillar 50 and the second pillar 52, and includes the first metal (that is, copper), but does not include the oxide of the second metal (that is, titanium dioxide). The first interface 56 is sandwiched between the first pillar 50 and the intermediate area 54, and includes the first metal and the oxide of the second metal, wherein the content percentage of the first metal in the first interface 56 is less than that of the first metal in the intermediate area 54. Similarly, the second interface 58 is sandwiched between the second pillar 52 and the intermediate area 54, and includes the first metal and the oxide of the second metal, wherein the content percentage of the first metal in the second interface 58 is less than that of the first metal in the intermediate area 54.

In the bonding process of this embodiment, copper-to-copper bonding (that is, bonding of the first pillar 50 and the second pillar 52) can be achieved without use of a solder; therefore, a pitch between the first pillars 50 or between the second pillars 52 can be effectively reduced, thereby achieving a fine pitch. In addition, the bonding process can be performed at a low temperature (for example, lower than about 180° C.), so that the first semiconductor element 38 and the second semiconductor element 42 are not easily warped, and the first pillar 50 and the second pillar 52 are not easily oxidized. Moreover, since the bonding process does not need to be performed in a vacuum environment, the manufacturing cost of vacuum pumping is avoided. Besides, the thrust test of the bonding structure can reach 37 kg/cm$^2$ or more, which shows that the bonding effect is quite good.

As used herein, the terms "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present invention has been described and illustrated with reference to specific embodiments thereof, these descriptions and illustrations do not limit the present invention. It should be understood by those skilled in the art that various changes may be made and equivalents may be substituted without departing from the true spirit and scope of the present invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and drawings are to be regarded as illustrative rather than restrictive. Modifications may be made to adapt a particular situation, material, composition of matter, method, or process to the objective, spirit and scope of the present invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present invention. Accordingly, unless specifically indicated herein, the order and grouping of the operations are not limitations of the present invention.

What is claimed is:

1. A semiconductor bonding structure, comprising:
    a first pillar comprising a first metal;
    a second pillar comprising the first metal;
    an intermediate area, located between the first pillar and the second pillar, and comprising the first metal;
    a first interface, located between the first pillar and the intermediate area, and comprising the first metal and an oxide of a second metal, wherein the content percentage of the first metal in the first interface is less than that of the first metal in the intermediate area; and
    a second interface, located between the second pillar and the intermediate area, and comprising the first metal and the oxide of the second metal, wherein the content percentage of the first metal in the second interface is less than that of the first metal in the intermediate area.

2. The semiconductor bonding structure according to claim 1, wherein the first metal is different from the second metal, the first metal is selected from the group consisting of silver, gold, aluminum and copper, and the second metal is selected from the group consisting of silver, gold, platinum, palladium, osmium, iridium, ruthenium, titanium, magnesium, aluminum, copper, cobalt, nickel and zinc.

3. The semiconductor bonding structure according to claim 1, wherein the first interface contacts the first pillar and the intermediate area, and the second interface contacts the second pillar and the intermediate area.

4. The semiconductor bonding structure according to claim 1, wherein the first interface is a discontinuous interface so that the first pillar contacts the intermediate area, and the second interface is a discontinuous interface so that the second pillar contacts the intermediate area.

5. The semiconductor bonding structure according to claim 1, wherein the first pillar and the second pillar are copper metal pillars.

6. The semiconductor bonding structure according to claim 1, wherein the intermediate area, the first pillar and the second pillar do not include the oxide of the second metal.

7. The semiconductor bonding structure according to claim 1, wherein the first metal in the intermediate area originates from the diffusion of the first metal in the first pillar and the second pillar.

8. A semiconductor bonding process, comprising:
    (a) providing a first semiconductor element and a second semiconductor element, the first semiconductor element including at least one first pillar and at least one first diffusion layer, the first pillar comprising a first metal, the first diffusion layer being located at an end of the first pillar and comprising a second metal, the second semiconductor element including at least one second pillar and at least one second diffusion layer, the second pillar comprising the first metal, the second diffusion layer being located at an end of the second pillar and comprising the second metal, and the thickness of at least one of the first diffusion layer and the second diffusion layer being 1 nm to 30 nm;
    (b) bonding the first semiconductor element to the second semiconductor element, so that the first diffusion layer contacts the second diffusion layer; and (c) applying a bonding force to the first semiconductor element and the second semiconductor element for a period of time, so that the first metal of the first pillar is diffused towards the second pillar, the first metal of the second pillar is diffused towards the first pillar, and they contact to form an intermediate area; an oxide of the second metal of the first diffusion layer is diffused towards the first pillar and is mixed with the first metal to form a first interface; and the oxide of the second metal of the second diffusion layer is diffused towards the second pillar and is mixed with the first metal to form a second interface.

9. The semiconductor bonding process according to claim 8, wherein in (a), the first semiconductor element includes a first semiconductor element body, an upper wiring layer, a lower wiring layer, a lower protection layer, an upper protection layer, at least one first UBM layer, the upper wiring layer and the lower wiring layer are respectively located on an upper surface and a lower surface of the first semiconductor element body, the lower protection layer covers the lower wiring layer and the lower surface of the first semiconductor element body, and has a plurality of openings to expose part of the lower wiring layer, the upper protection layer covers the upper wiring layer and the upper surface of the first semiconductor element body, and has a plurality of openings to expose part of the upper wiring layer, the first UBM layer is located at one of the openings of the upper protection layer, and contacts the upper wiring layer, the first pillar is located on the first UBM layer.

10. The semiconductor bonding process according to claim 8, wherein in (a), the second semiconductor element includes a second semiconductor element body, a wiring layer, a protection layer, at least one second UBM layer, the wiring layer is located on a first surface of the second semiconductor element body, the protection layer covers the wiring layer and the first surface of the second semiconductor element body, and has a plurality of openings to expose part of the wiring layer, the second UBM layer is located at one of the openings of the protection layer, and contacts the wiring layer, the second pillar is located on the second UBM layer.

11. The semiconductor bonding process according to claim 8, wherein in (c), a bonding temperature is further provided, wherein the bonding temperature is lower than 180° C.

12. The semiconductor bonding process according to claim 8, wherein in (a), the first metal is different from the second metal, the first metal is selected from the group consisting of silver, gold, aluminum and copper, and the second metal is selected from the group consisting of silver, gold, platinum, palladium, osmium, iridium, ruthenium, titanium, magnesium, aluminum, copper, cobalt, nickel and zinc.

13. The semiconductor bonding process according to claim 8, wherein in (c), the first interface contacts the first pillar and the intermediate area, and the second interface contacts the second pillar and the intermediate area.

14. The semiconductor bonding process according to claim 8, wherein in (c), the first interface is a discontinuous interface so that the first pillar contacts the intermediate area, and the second interface is a discontinuous interface so that the second pillar contacts the intermediate area.

15. The semiconductor bonding process according to claim 8, wherein in (c), the first pillar, the first diffusion layer, the second pillar and the second diffusion layer are heated at atmospheric pressure.

16. The semiconductor bonding process according to claim 8, wherein in (c), the content percentage of the first metal in the first interface is less than that of the first metal in the intermediate area, and the content percentage of the first metal in the second interface is less than that of the first metal in the intermediate area.

17. The semiconductor bonding process according to claim 9, wherein the first semiconductor element further includes a plurality of conductive vias, the conductive vias penetrate through the first semiconductor element body, and contact and are electrically connected to the upper wiring layer and the lower wiring layer.

* * * * *